United States Patent
Schmidhammer

(10) Patent No.: US 8,760,239 B2
(45) Date of Patent: Jun. 24, 2014

(54) IMPEDANCE MATCHING CIRCUIT FOR MATCHING PLANAR ANTENNAS

(75) Inventor: Edgar Schmidhammer, Stein an der Traun (DE)

(73) Assignee: Qualcomm Technologies, Inc., San Diego, CA (US)

( * ) Notice: Subject to any disclaimer, the term of this patent is extended or adjusted under 35 U.S.C. 154(b) by 518 days.

(21) Appl. No.: 13/120,260

(22) PCT Filed: Oct. 6, 2009

(86) PCT No.: PCT/EP2009/062981
§ 371 (c)(1),
(2), (4) Date: Jun. 2, 2011

(87) PCT Pub. No.: WO2010/040752
PCT Pub. Date: Apr. 15, 2010

(65) Prior Publication Data
US 2011/0221543 A1    Sep. 15, 2011

(30) Foreign Application Priority Data
Oct. 8, 2008    (DE) .......................... 10 2008 050 743

(51) Int. Cl.
*H03H 7/38*    (2006.01)
(52) U.S. Cl.
CPC ...................................... *H03H 7/38* (2013.01)
USPC ........................................................ 333/32
(58) Field of Classification Search
USPC ............................ 333/32, 167, 174, 175, 176
See application file for complete search history.

(56) References Cited

U.S. PATENT DOCUMENTS

| | | |
|---|---|---|
| 5,778,308 A | 7/1998 | Sroka et al. |
| 6,670,864 B2 | 12/2003 | Hyvönen et al. |
| 2003/0030504 A1* | 2/2003 | Dixit et al. ...................... 333/32 |
| 2008/0106349 A1 | 5/2008 | McKinzie |
| 2009/0278748 A1 | 11/2009 | Sako et al. |
| 2013/0181788 A1* | 7/2013 | Wan ................................ 333/32 |

FOREIGN PATENT DOCUMENTS

| | | |
|---|---|---|
| DE | 695 31 804 T2 | 7/2004 |
| DE | 601 25 100 T2 | 7/2007 |
| JP | 04-34023 U | 3/1992 |
| JP | 10-56339 A | 2/1998 |

(Continued)

OTHER PUBLICATIONS

Krautkrämer V.W., et al., "Resonanztransformatoren mit drei Reaktanzen als transfomierende Filter," Bulletin des Schweizerischen, Elektrotechnischen Vereins, Schweizerischer, Zürich, CH; Bd. 64, Nr. 23, Nov. 10, 1973, XP002184530, pp. 1500-1509.

(Continued)

*Primary Examiner* — Stephen Jones
(74) *Attorney, Agent, or Firm* — Smith Risley Tempel Santos LLC

(57) ABSTRACT

A circuit includes a signal path having a node between a signal path input and a signal path output. A first inductive element is connected between the signal path input and the node and a first capacitive element whose capacitance is variably adjustable is connected between the node and the signal path output. A second variable-capacitance capacitive element is connected between the signal path input and ground. A second inductive element is connected between the node and ground, and a third inductive element is connected between the signal path output and ground.

25 Claims, 1 Drawing Sheet

(56) References Cited

FOREIGN PATENT DOCUMENTS

| JP | 10-209897 A | 8/1998 |
| JP | 2001-185962 A | 7/2001 |
| JP | 2004-242269 A | 8/2004 |
| WO | WO 96/29756 | 9/1996 |
| WO | WO 2006/034838 A1 | 4/2006 |
| WO | WO 2006/129239 A1 | 12/2006 |
| WO | WO 2007/102293 A1 | 9/2007 |

OTHER PUBLICATIONS

Goldsmith, C.L., et al., "RF MEMS Variable Capacitors for Tunable Filter," International Journal of RF and Microwave Computer-Aided Engineering, 1999, John Wiley & Sons, Inc., pp. 362-374.
International Search Report and Written Opinion—PCT/EP2009/062981—ISA/EPO—Dec. 28, 2009.

\* cited by examiner

IMPEDANCE MATCHING CIRCUIT FOR MATCHING PLANAR ANTENNAS

This patent application is a national phase filing under section 371 of PCT/EP2009/062981, filed Oct. 6, 2009, which claims the priority of German patent application 10 2008 050 743.1, filed Oct. 8, 2008, each of which is incorporated herein by reference in its entirety.

TECHNICAL FIELD

The invention relates to an impedance matching circuit for matching the impedance of PILA-type planar antennas.

BACKGROUND

Planar antennas are antennas which are not matched to a defined impedance but require a matching network for maximum power transmission.

A connection of a planar antenna to an associated impedance matching circuit is known, for example, from the International publication WO 2006/129239 A1. In addition to a plurality of inductive elements, the impedance matching circuit in the document comprises a plurality of MEMS switches as capacitive elements. The capacitance of a MEMS switch can assume two discrete values, and the plurality of connected MEMS switches enables a sufficient tuning range for impedance matching.

One challenge with of known impedance matching circuits for planar antennas is that either the tuning range is too small or the impedance matching circuit has a high level of complexity and a large number of connected elements. The latter results in a relatively high degree of susceptibility to defects.

In one aspect, the present invention specifies an impedance matching circuit with reduced complexity and a reduced number of circuit elements, which circuit nevertheless enables a sufficient tuning range.

Embodiments of the invention comprise a signal path having a node between a signal path input and a signal path output. A first inductive element is connected between the signal path input and the node and a first capacitive element whose capacitance is variably adjustable is connected between the node and the signal path output. A second adjustable-capacitance capacitive element is connected between the signal path input and ground. A second inductive element is connected between the node and ground, and a third inductive element is connected between the signal path output and ground.

Such a connection whose signal path input can be connected, for example, to transmitting or receiving paths of a front-end circuit for mobile radios and whose signal path output is intended to be connected to a planar antenna is a simple, that is to say not very complex, circuit for matching the impedance of the antenna to that of the front-end circuit. The third inductive element may act as an ESD (electrostatic discharge) protective element of the impedance matching circuit and/or the connected front-end circuit. Current pulses which act via the antenna and could damage the front-end circuit or individual components of the latter are then harmlessly discharged to ground via the inductive element.

The first, second and third inductive elements advantageously have Q factors of greater than 15 and the first and second capacitive elements advantageously have Q factors of greater than 10. In this case, the Q factor is a dimensionless measure of the ratio of amplitude to bandwidth of resonance curves or of energy losses in the circuit. In addition, the elements of the impedance matching circuit are advantageously dimensioned in such a manner that the inductances of the first, second and third inductive elements have values of between 0.5 and 22 nH and the capacitances of the first and second capacitive elements can be adjusted in intervals between 0.5 and 12 pF. Such intervals may cover, for example, the capacitance ranges of 0.5 pF to 1.5 pF, of 0.9 pF to 3.2 pF or of 2.6 pF to 8.5 pF.

In one advantageous refinement, the impedance matching circuit comprises a third capacitive element having a Q factor of greater than 50 and a capacitance of between 1 and 35 pF and a fourth inductive element having a Q factor of greater than 15 and an inductance of between 0.5 and 10 nH, which elements are connected in series with one another between the signal path input and ground. Another variation of the impedance matching circuit involves connecting a fourth capacitive element having a Q factor of greater than 50 and a capacitance of between 4 and 18 pF between the signal path input and ground.

The impedance matching circuit is advantageously used in a mobile communication device, the circuit being connected between a receiving path or a transmitting path and a planar antenna, in particular of the PILA type, in such a manner that the signal path input is connected to the transmitting and receiving paths in an electrically conductive manner, and the signal path output is connected to the planar antenna in an electrically conductive manner via an antenna lead having an impedance of between 10 and 60 ohms.

According to one advantageous refinement of the impedance matching circuit, the standing wave ratio in the transmitting path is better (that is to say less) than 3 and the standing wave ratio in the receiving path is better (that is to say less) than 4.

The invention is suitable for matching the impedances of planar antennas in CDMA, W-CDMA, GSM, DVBH, W-LAN, WIFI or other customary data transmission systems in frequency bands between 500 and 4500 MHz.

The tuning ratio of the first or second capacitive element is between 2.5:1 and 3.5:1, that is to say 3:1, for example, in one variant, but is between 3.5:1 and 4.5:1 or between 4.5:1 and 5.5:1 in other advantageous variants and is between 5.5:1 and 6.5:1 in a particularly advantageous variant. In this case, the tuning ratio is respectively defined as the quotient of the largest adjustable capacitance and smallest adjustable capacitance.

At least one of the capacitive elements is preferably a varactor diode whose dielectric layer comprises barium strontium titanate (BST) or whose dielectric layer comprises bismuth zinc niobate (BZN), or alternatively a capacitive element produced using CMOS technology, a connection of MEMS capacitors or a semiconductor varactor diode.

It is preferred to select, as the fourth capacitive element, an element whose Q factor is greater than that of the second capacitive element.

In another advantageous refinement, a fifth capacitive element is connected in parallel with the first capacitive element between the node and the signal path output. In addition, it is preferred to connect a directional coupler to the signal path input in the signal path. A directional coupler makes it possible to determine the fraction of transmitting energy which is actually injected into the antenna from the transmitting signal path. Impedance matching can therefore be reduced to maximizing this fraction. A similar situation applies to reception signals injected into the receiving signal path from the antenna.

It is also very advantageous if the impedance matching circuit comprises a duplexer connected to the signal path input as part of a front-end module.

The inductive and capacitive elements of the matching circuit are preferably in the form of patterned metallizations in a multilayer substrate which may comprise layers of HTCC, LTCC, FR4 or laminate. As a result, a corresponding component also has a space-saving design in addition to its low level of complexity.

In another refinement, an antenna lead having an impedance of between 10 and 60 ohms is connected between the signal path output and a connected planar antenna.

BRIEF DESCRIPTION OF THE DRAWINGS

The impedance matching circuit is explained in more detail below using exemplary embodiments and associated schematic figures.

Figure 1:
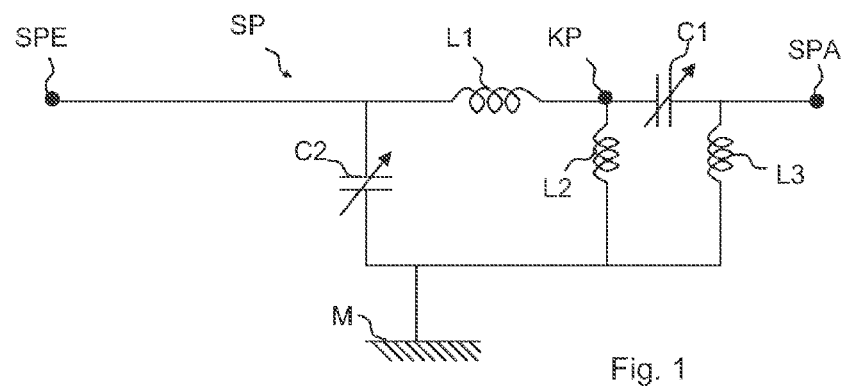
FIG. 1 shows an impedance matching circuit which comprises inductive and capacitive elements and is connected between a signal path input and a signal path output.

The following list of reference symbols can be used in conjunction with the drawing
AL: Antenna lead
C1: First capacitive element
C2: Second capacitive element
C3: Third capacitive element
C4: Fourth capacitive element
C5: Fifth capacitive element
FE: Front-end module
KP: Node
L1: First inductive element
L2: Second inductive element
L3: Third inductive element
L4: Fourth inductive element
M: Ground
PILA: Planar Inverted L-Antenna
RK: Directional coupler
SP: Signal path
SPA: Signal path output
SPE: Signal path input

DETAILED DESCRIPTION OF ILLUSTRATIVE EMBODIMENTS

FIG. 1 shows a low-complexity impedance matching circuit for planar antennas, which circuit enables a sufficient tuning range. In the signal path SP, a first inductance L1 is connected between the signal path input SPE and the node KP and a first capacitive element C1 whose capacitance is variably adjustable is connected between the node KP and the signal path output SPA. A second capacitive element C2 whose capacitance is likewise adjustable is connected between the signal path input SPE and ground M. In addition, a second inductive element L2 is connected between the node KP and ground M and a third inductive element L3 is connected between the signal path output SPA and ground M.

Figure 2:
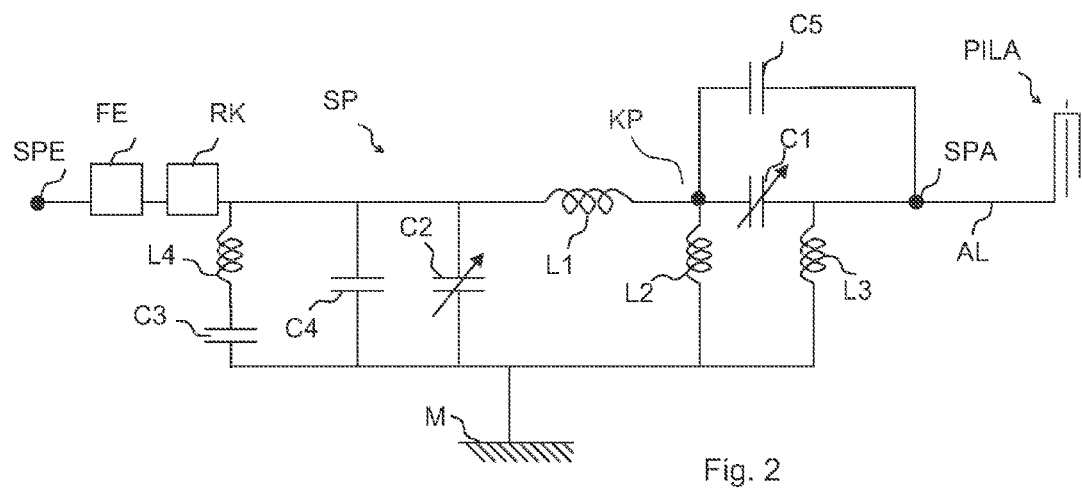
FIG. 2 shows the impedance matching circuit from FIG. 1 with further circuit elements.

FIG. 2 shows the impedance matching circuit from FIG. 1, which shows features of other advantageous refinements. A directional coupler RK is connected between the signal path input SPE and the node KP in the signal path SP. In this case, the directional coupler RK is connected to the signal path input SPE. At least parts of a front-end module FE are connected between the directional coupler RK and the signal path input SPE. The front-end module FE may comprise one or more duplexers, amplifiers or other filter elements or circuit elements. The connection of the signal path input, front-end module, directional coupler and node is illustrated only symbolically. A fourth inductive element L4 and a third capacitive element C3 are connected in series between the signal path SP and ground M. A fourth capacitive element C4 is likewise connected between the signal path SP and ground. A fifth capacitive element C5 is connected in parallel with the first capacitive element C1 between the node KP and the signal path output SPA. A planar antenna PILA which may be, in particular, of the "Planar Inverted L-Antenna" (PILA for short) type is connected to the signal path output SPA via an antenna lead AL.

A filter circuit according to the invention is not restricted to one of the exemplary embodiments described. Combinations thereof and variations which comprise yet further inductive or capacitive elements, for example, are likewise exemplary embodiments according to the invention.

The invention claimed is:

1. An impedance matching circuit for matching planar antennas, comprising:
a signal path having a node between a signal path input and a signal path output;
a first inductive element coupled between the signal path input and the node;
a first variable-capacitance capacitive element coupled between the node and the signal path output;
a second variable-capacitance capacitive element coupled between the signal path input and a ground;
a second inductive element coupled between the node and ground; and
a third inductive element coupled between the signal path output and ground.

2. The impedance matching circuit according to claim 1, wherein the first, second and third inductive elements have Q factors of greater than 15 and wherein the first and second variable-capacitance capacitive elements have Q factors of greater than 10.

3. The impedance matching circuit according to claim 1, wherein the first inductive element has an inductance of between 0.5 and 22 nH, wherein the second inductive element has an inductance of between 0.5 and 22 nH, and wherein the third inductive element has an inductance of between 0.5 and 22 nH, and wherein the first capacitive element and the second capacitive element each have a capacitance that can be adjusted between 0.5 and 12 pF.

4. The impedance matching circuit according to claim 1, wherein a tuning ratio of one of the variable-capacitance capacitive elements is between 3.5:1 and 4.5:1.

5. The impedance matching circuit according to claim 1, wherein a tuning ratio of one of the variable-capacitance capacitive elements is between 4.5:1 and 5.5:1.

6. The impedance matching circuit according to claim 1, wherein a tuning ratio of one of the variable-capacitance capacitive elements is between 5.5:1 and 6.5:1.

7. The impedance matching circuit according to claim 1, wherein the first and/or the second variable-capacitance element comprises a variable-capacitance capacitive element selected from the group co of a varactor diode with a dielectric layer comprising barium strontium titanate, a varactor diode with a dielectric layer comprising bismuth zinc niobate, a capacitive element produced using CMOS technology, a connection of MEMS capacitors and a semiconductor varactor diode.

8. The impedance matching circuit according to claim 1, further comprising a fifth capacitive element coupled between the node and the signal path output in parallel with the first capacitive element.

9. The impedance matching circuit according to claim 1, further comprising a directional coupler coupled to the signal path input.

10. The impedance matching circuit according to claim 1, further comprising a front-end module coupled to the signal path input.

11. The impedance matching circuit according to claim 1, further comprising a duplexer coupled to the signal path.

12. The impedance matching circuit according to claim 1, wherein the first, second and third inductive elements are in the form of metallizations in a multilayer substrate selected from HTCC, LTCC, FR4 and laminate.

13. The impedance matching circuit according to claim 1, further comprising a third capacitive element having a Q factor of greater than 50 and a capacitance of between 1 and 35 pF and a fourth inductive element having a Q factor of greater than 15 and an inductance of between 0.5 and 10 nH, wherein the third capacitive element and the fourth inductive element are coupled in series between the signal path input and ground.

14. The impedance matching circuit according to claim 13, further comprising a fourth capacitive element which has a Q factor of greater than 50 and a capacitance of between 4 and 18 pF and is coupled between the signal path input and ground.

15. The impedance matching circuit according to claim 14, wherein the Q factor of the fourth capacitive element is greater than a Q factor of the second variable-capacitance capacitive element.

16. The impedance matching circuit according to claim 1, wherein a tuning ratio of one of the variable-capacitance capacitive elements is between 2.5:1 and 3.5:1.

17. The impedance matching circuit according to claim 16, wherein the tuning ratio of one of the variable-capacitance capacitive elements is 3:1.

18. The impedance matching circuit according to claim 1, wherein the impedance matching circuit is configured for use in a mobile communication device having a transmitting path, a receiving path and a PILA-type planar antenna, wherein
the signal path input is coupled to the transmitting path and to the receiving path, and
wherein the signal path output is coupled to the planar antenna via an antenna lead having an impedance of between 10 ohms and 60 ohms.

19. The impedance matching circuit according to claim 18, wherein the impedance matching circuit is configured to match the transmitting path in a transmitting frequency band and the receiving path in a receiving frequency band to the planar antenna with a standing wave ratio in the transmitting path of less than 3.

20. The impedance matching circuit according to claim 18, wherein the impedance matching circuit is configured to match the transmitting path in a transmitting frequency band and the receiving path in a receiving frequency band to the planar antenna with a standing wave ratio in the receiving path of less than 4.

21. The impedance matching circuit according to claim 18, wherein the impedance matching circuit is configured for use in CDMA, W-CDMA or GSM frequency bands between 500 and 4500 MHz.

22. The impedance matching circuit according to claim 18, wherein the impedance matching circuit is configured for use in DVB-H, W-LAN or WIFI frequency bands between 500 and 4500 MHz.

23. The impedance matching circuit according to claim 18, further comprising an antenna lead coupled between the signal path output and the planar antenna, the antenna lead having an impedance of between 10 and 60 ohms.

24. An impedance matching circuit for matching planar antennas, comprising
a signal path having a node between a signal path input and a signal path output;
a first inductive element coupled between the signal path input and the node;
a first variable-capacitance capacitive element coupled between the node and the signal path output;
a second variable-capacitance capacitive element coupled between the signal path input and a ground node;
a second inductive element coupled between the node and the ground node;
a third inductive element coupled between the signal path output and the ground node;
a third capacitive element;
a fourth inductive element, wherein the third capacitive element and the fourth inductive element are coupled in series between the signal path input and the ground node;
a fourth capacitive element coupled between the signal path input and the ground node; and
a fifth capacitive element coupled between the node and the signal path output in parallel with the first capacitive element.

25. The impedance matching circuit according to claim 24, further comprises a directional coupler coupled to the signal path input and a front-end module coupled to the signal path input.

* * * * *